US006194654B1

(12) United States Patent
Buehler et al.

(10) Patent No.: US 6,194,654 B1
(45) Date of Patent: Feb. 27, 2001

(54) SHIELD CONNECTION SYSTEM AND CONNECTOR USING THE SAME

(75) Inventors: Roland Buehler, Heilbronn; Frank Ott, Oranienburg, both of (DE)

(73) Assignees: Amphenol-Tuchel Electronics GmbH; ABB Diamler-Benz Transportation (Deutschland) GmbH, both of (DE)

(*) Notice: Subject to any disclaimer, the term of this patent is extended or adjusted under 35 U.S.C. 154(b) by 0 days.

(21) Appl. No.: 09/064,603

(22) Filed: Apr. 23, 1998

(30) Foreign Application Priority Data

Apr. 25, 1997 (DE) .............................................. 197 17 628

(51) Int. Cl.[7] ...................................................... H05K 9/00

(52) U.S. Cl. .................. 174/35 C; 174/88 C; 174/84 C; 174/78; 174/845; 174/88 R

(58) Field of Search ............................... 174/35 C, 88 C, 174/84 R, 78, 84 S, 88 R

(56) References Cited

U.S. PATENT DOCUMENTS 2,173,643 * 9/1939 Moser ................................ 174/75 C
3,603,912 * 9/1971 Kelly ............................ 174/65 SS X
4,464,540 * 8/1984 Reeder ............................... 174/35 C
4,692,562 * 9/1987 Nattel ............................... 174/65 SS
4,810,832 * 3/1989 Spinner et al. .................. 174/65 SS
5,174,769 12/1992 Dearman ................................ 439/98
5,432,301 * 7/1995 Gehring ................................. 174/78
5,474,473 12/1995 Parretta et al. ...................... 439/610

FOREIGN PATENT DOCUMENTS 30 28 800 2/1989 (DE) .
39 13 544 10/1990 (DE) .
40 02 188 4/1991 (DE) .
195 28 234 2/1997 (DE) .

* cited by examiner

*Primary Examiner*—William A. Cuchlinski, Jr.
*Assistant Examiner*—Ronnie Mancho
(74) *Attorney, Agent, or Firm*—Blank Rome Comisky & McCauley, LLP

(57) ABSTRACT

A shield connection system for connecting the shields of several individual lines through clamping of the shields between an outer cone and an inner cone, characterized in that a conical ring comprising an outer cone is provided, over which the shields of the individual lines lie spread out, and that the conical ring is pressed against an inner cone provided on part of the adapter.

11 Claims, 1 Drawing Sheet

SHIELD CONNECTION SYSTEM AND CONNECTOR USING THE SAME

TECHNICAL FIELD

The invention relates to a shield connection system and a connector using the same. The system is used for connecting the shield, especially the shields of several individually shielded lines, by means of clamping of the shield between an outer cone and an inner cone. In general, the invention relates to a shield connection system, in which a good electrical connection is provided between a connector housing and a cable shield, also together with good electromagnetic shielding characteristics.

BACKGROUND ART

Numerous designs for shield connection systems are known, in particular in the form of a shield adapter. For instance, it is known, for individual lines or cables, to clamp the shielding of each individual line between respective individual conical components corresponding to each individual line, wherein the conical components are pressed together by a respective compression screw. This is disadvantageous in that two conical components are necessary for each line having a shield.

SUMMARY OF THE INVENTION

It is an object of the present invention to provide a shield connection system and a connector using such system, in particular for cable sets, wherein each cable set consists of several individually shielded lines, such that a connection is provided having good electromagnetic shielding characteristics.

A further object of the invention is to provide good electromagnetic shielding of an existing space in a connector used with several individually shielded lines. In addition to this improved shielding of an existing space, which results in higher shielding values, a simplified shield connection system is to be achieved.

To achieve this object, the invention provides for a shield connection system, in which a (single) conical ring having an outer cone is provided. All of the shields of the individual lines are located over said conical ring in a spread out manner. The conical ring itself is pressed against an inner cone that is preferably formed on a part of a connector, preferably an adapter of a connector. The conical ring preferably comprises a plurality of openings, one for accepting each of the individual and individually shielded lines or cables.

Through the use, in accordance with the invention, of a preferably closed, conical ring with individual openings, through which the individual lines are inserted, favorable shielding and operating conditions result.

BEST MODE FOR CARRYING OUT THE INVENTION

Figure 1:
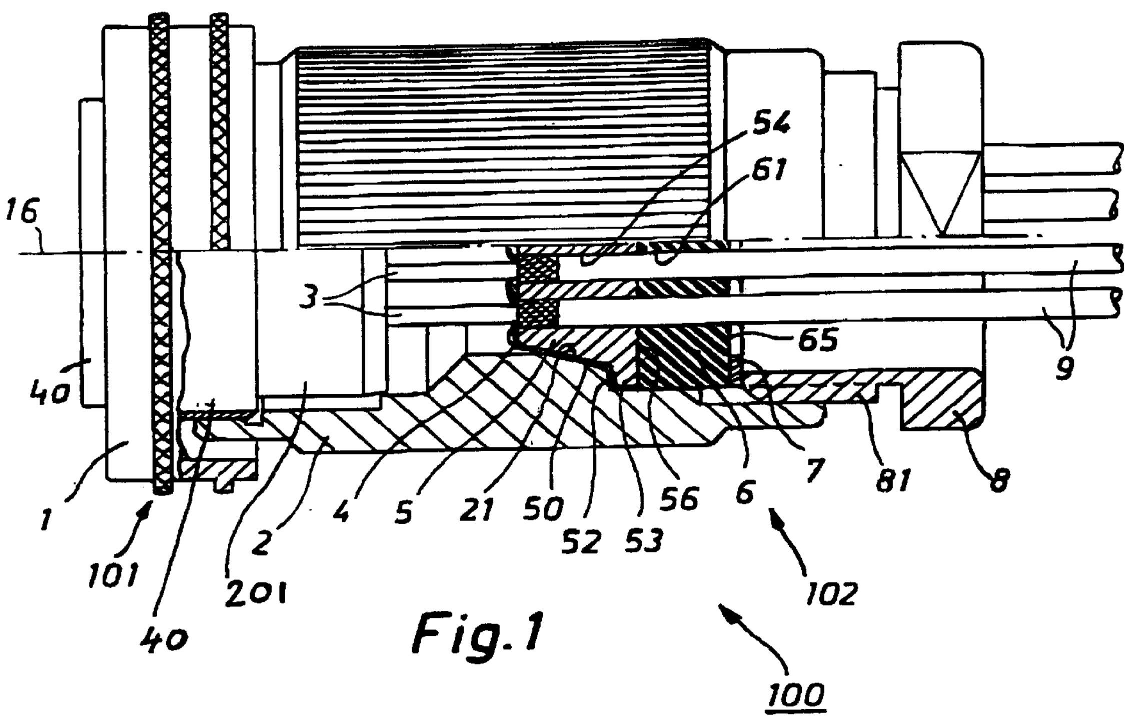
FIG. 1 is a partial cross-sectional and partial side elevational view of a connector in accordance with the invention with a shield contacting system comprising a shield adapter in accordance with the invention.

FIG. 1 shows a connector preferably a round or circular connector 100 in accordance with the invention. The connector 100 comprises connector section 101 and a shield connection section or shield connection system 102. The shield connection system 102 of the connector 100 preferably comprises a shield adapter 2. The shield adapter 2, preferably made of metal, has a circular sleeve-like form and comprises thread means, preferably inner thread means, on each of its two opposite openings. In the right thread means, a compression screw 8 is screwed into said inner thread means, with its outer thread 81, whereas the left thread serves for connecting with the actual connector 101, comprising, as shown, for example, an insulating body or connector insert 201 which supports contact elements (not shown), and a connector housing 40 is screwed into the left thread of the shield adapter 2. Alternatively (but not shown) a component of the actual connector 101 surrounding the insulating body 201 can be fastened to the shield adapter 102.

A coupling nut 1 having an inner thread is rotatably mounted in a suitable manner on the connector housing 40 to allow the connection of the connector 100 and connector section 101 to a further connector (not shown) or a socket or the like. For this reason, either contact pins or contact sockets are provided in the insulating body 201 of the connector section 101. The contact pins or sockets located in the insulating body 201 are connected (see FIG. 2) to wires 10 of the individual lines 3. The individual lines 3 are insulated and are each surrounded by a shield 4 and form several shielded lines 9 that can also be designated as individually shielded cables 9, forming a cable set.

The shield adapter 2 comprises, on its inner side, a preferably continuous, annular inner conical surface (inner cone) 21 that runs at a conical outward slant with respect to the central axis 16 of the connector 100. The slant of the inner cone lies preferably in the range of 10° to 20° with respect to the central axis 16 and runs inwardly from the cable entrance side in the direction of the connector section 101.

Figure 2:
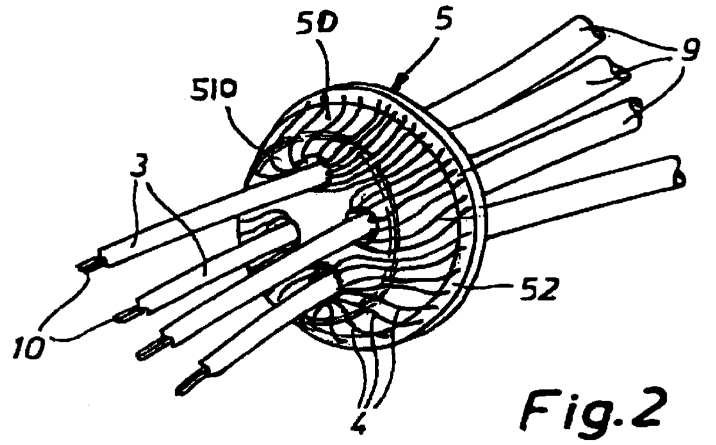
FIG. 2 is a schematic, perspective view of a conical ring as is employed in the preferred embodiment of FIG. 1.

A single conical annular ring 5 is adapted to cooperate with the inner cone of adapter 2. FIG. 2 shows details of said preferably closed conical ring 5 formed in accordance with the invention. Ring 5 is preferably made of metal and is assembled into the adapter 2, i.e. into the connector 100 of FIG. 1. The conical ring 5 comprises an outer cone or an outer conical surface 50 that has approximately the same slant as the inner conical surface 21. The conical ring 5 forms, adjacent to the outer conical surface 21, a preferably radially extending contact surface 52 along a widened bottom section 53. As one can see in FIG. 1 and 2, the shields 4 of the individual cables 9 are entirely spread out and spread over a front section 510 onto the outer conical surface 50 and preferably also onto the contact surface 52. As one can see in FIG. 1, the outer conical surface 50 is longer in the axial direction than the inner conical surface 21 of the shield adapter 2.

In accordance with the invention, an elastomeric or rubber ring 6 is furthermore preferably provided. Ring 6 has approximately the same diameter as the conical ring 5 and is provided with openings 61 that line up with corresponding openings 54 of the conical ring 5. Said openings 61 and 54 are adapted to receive said individual lines 9 that are individually shielded. The rubber ring 6 lies with its front face on a support surface 56 of the conical ring 5. Preferably, a disk 7 lies against a rear face 65 of said rubber ring 5 that lies opposite to support surface 56. The disk 7 itself can be pressed against the rubber ring 6 by means of a compression screw 8 in order to press the two conical surfaces 21 and 51 together, as well as the shields 4 lying therebetween, in order to provide good contact. The disk 7 is preferably provided only in the peripheral area of said rubber ring 5. When the compression screw 8 is tightened, the openings 61 provided in the rubber ring 6 are distorted such that a strain relief is effected. The compression screw 8 with its outer thread 81 is screwed into the aforementioned opening of the shield adapter 2.

The invention thus achieves a connection of the connector 100 with the individually shielded lines 9 of a cable bundle with appropriate electromagnetic shielding, namely via the closed, conical ring 5, through whose individual openings 54 the individually shielded lines are inserted, whereby contact with the shield adapter 2 or the housing of the connector section 101 is carried out via the conical ring 5.

It is noted that the measures in accordance with the invention can be employed, practically elsewhere as a shield connection system in general, not only for a shield adapter. In particular, the invention can be employed as a cable input means (cable feed) for shielded cable, in particular also for metallic connector housings, circuit boxes and distribution boxes, etc with threaded mounts of the so-called armored thread screw type, through which the cables are fed.

Even though a round connector has been shown, the invention is also applicable with rectangular connectors having round cable termination, means.

As mentioned the adapter 2 and/or the preferably closed conical ring 5 having individual openings are preferably made of metal, but can also be made of metallized plastic material. This is also true for the compression screw.

What is claimed is:

1. A shield connection system for connecting individual shields of several individual transmission lines by clamping the shields between an outer conical surface and an inner conical surface, comprising a conical ring having a widened bottom section with a support surface, said conical ring providing said outer conical surface, over which the individual shields of the individual transmission lines are spread, an adapter providing an inner conical surface, wherein said conical ring is adapted to be pressed against said inner conical surface thereby clamping the shields between said surfaces and a rubber ring in contact with the support surface of the conical ring and having openings for each one of the shielded transmission lines.

2. The shield connection system of claim 1 wherein the conical ring comprises respective openings for receiving respective ones of said individual transmission lines.

3. The shield connection system of claim 2 wherein the inner conical surface and the outer conical surface each comprise a slope running at between 10° and 20° with respect to a longitudinal axis of said system.

4. The shield connection system of claim 3 wherein the slopes of the conical surface run toward the longitudinal axis in a direction away from a cable entrance end of said shield connection system.

5. The shield connection system of claim 1 wherein the conical ring is made of metal and comprises a widened bottom section with a support surface.

6. The shield connection system of claim 5 wherein, adjacent to the inner conical surface, the adapter forms a radially extending support surface that cooperates with the widened bottom section of said conical ring.

7. The shield connection system of claim 6, wherein the shields lie between said radially extending support surface and said widened bottom section.

8. The shield connection system of claim 1, wherein the outer conical surface is longer in the axial direction that the inner conical surface.

9. The shield connection system of claim 1 wherein a disk sits against the rubber ring and forms a support for a compression screw such that a force is exerted via the rubber ring to the conical ring, said force pressing the conical surfaces together with the shield lying therebetween.

10. The shield connection system of claim 1 wherein said conical ring and said adapter are made of metal or metallized plastic.

11. The shield connection system of claim 1 wherein said rubber ring and its openings line up with the openings of the conical ring and are distorted through the tightening of the compression screw such that the individual transmission lines are held in their position, whereby a strain relief is effected.

* * * * *